United States Patent
Jiang et al.

(10) Patent No.: US 12,041,733 B2
(45) Date of Patent: Jul. 16, 2024

(54) FLEXIBLE DISPLAY PANEL SUPPORT AND FLEXIBLE DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Zhiliang Jiang, Beijing (CN); Pan Zhao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 205 days.

(21) Appl. No.: 17/765,052

(22) PCT Filed: Jul. 5, 2021

(86) PCT No.: PCT/CN2021/104519
§ 371 (c)(1),
(2) Date: Mar. 30, 2022

(87) PCT Pub. No.: WO2022/042044
PCT Pub. Date: Mar. 3, 2022

(65) Prior Publication Data
US 2022/0400559 A1    Dec. 15, 2022

(30) Foreign Application Priority Data
Aug. 24, 2020   (CN) .......................... 202021785702.2

(51) Int. Cl.
*H05K 5/00*   (2006.01)

(52) U.S. Cl.
CPC ................................. *H05K 5/0018* (2022.08)

(58) Field of Classification Search
CPC ........................... H05K 5/0017; H05K 5/0217
USPC ........................................................ 361/807
See application file for complete search history.

(56) References Cited

U.S. PATENT DOCUMENTS

| | | | |
|---|---|---|---|
| 2013/0002583 A1* | 1/2013 | Jin | G06F 3/041 313/511 |
| 2016/0062185 A1 | 3/2016 | Cheng et al. | |
| 2016/0172428 A1* | 6/2016 | Song | H10K 59/131 257/40 |
| 2019/0191582 A1* | 6/2019 | Olien | H02N 2/028 |

(Continued)

FOREIGN PATENT DOCUMENTS

| | | |
|---|---|---|
| CN | 104280923 A | 1/2015 |
| CN | 107978623 A | 5/2018 |

(Continued)

*Primary Examiner* — Hung S. Bui
(74) *Attorney, Agent, or Firm* — HOUTTEMAN LAW LLC

(57) ABSTRACT

The present disclosure relates to the field of display, and provides a flexible display panel support and a flexible display device. The flexible display panel support includes a support body, and the support body includes a plane region and two curved regions located at two sides of the plane region. An alignment mark structure is disposed on the support body, and the alignment mark structure is located in the plane region and is at a position corresponding to a non-display area of the flexible display panel to implement alignment of the support body with the flexible display panel.

12 Claims, 3 Drawing Sheets

(56) References Cited

U.S. PATENT DOCUMENTS

2021/0233438 A1    7/2021  Mao et al.
2023/0104021 A1*   4/2023  Jiang ..................... G09F 9/301
                                                          361/807

FOREIGN PATENT DOCUMENTS

| | | | | |
|---|---|---|---|---|
| CN | 108389876 | * | 8/2018 | ............ H01L 27/32 |
| CN | 110767084 | A | 2/2020 | |
| CN | 111391295 | A | 7/2020 | |
| CN | 111554190 | A | 8/2020 | |
| CN | 111564113 | A | 8/2020 | |
| CN | 212724533 | U | 3/2021 | |
| KR | 100659117 | B1 | 12/2006 | |
| WO | WO2019214083 | A | 11/2019 | |

* cited by examiner

FLEXIBLE DISPLAY PANEL SUPPORT AND FLEXIBLE DISPLAY DEVICE

CROSS-REFERENCE TO RELATED APPLICATION

This application is a National Phase Application filed under 35 U.S.C. 371 as a national stage of PCT/CN2021/104519, filed on Jul. 5, 2021, an application claiming the priority of the Chinese patent application No. 202021785702.2, filed on Aug. 24, 2020, the contents of which are incorporated herein by reference in their entirety.

TECHNICAL FIELD

The present disclosure relates to the technical field of display device, in particular to a flexible display panel support and a flexible display device.

BACKGROUND

With continuous development of mobile phone industry, consumers are more and more favored to mobile phones with a foldable screen since foldable screen made its debut on the market. A foldable screen generally includes a display panel and a flexible display panel support. For a conventional two-dimensional foldable screen, the flexible display panel support and the display panel can be aligned by capturing intersection points of boundaries of the flexible display panel support.

SUMMARY

At least one embodiment of the present disclosure provides a flexible display panel support, the flexible display panel support comprises a support body, the support body comprises a plane region and two curved regions located at two sides of the plane region, wherein an alignment mark structure is disposed on the support body, the alignment mark structure is located in the plane region and is at a position corresponding to a non-display area of the flexible display panel to implement alignment of the support body with the flexible display panel.

Optionally, the alignment mark structure includes a notch formed at an edge of the support body.

Optionally, an orthographic projection of the notch on a plane parallel to the plane region has a shape including three edges of a rectangle.

Optionally, an orthographic projection of the notch on a plane parallel to the plane region has a shape including a circular arc.

Optionally, a central angle of the circular arc is less than or equal to 180°.

Optionally, the plane region is rectangular, and the two curved regions are located on two opposite side edges of the plane region, respectively:
the number of the notch is plural, and both other two opposite side edges of the plane region are provided with at least one of the notches.

Optionally, the at least one of the notches on both the other two opposite side edges of the plane region are disposed symmetrically with respect to a center of the plane region.

Optionally, two notches are correspondingly disposed on each of the other two opposite side edges of the plane region, and the two notches are each located at a position close to a corner of the plane region.

Optionally, the flexible display panel support is made of a material comprising stainless steel.

As another technical scheme, an embodiment of the present disclosure further provides a flexible display device including a flexible display panel support and a flexible display panel, and the flexible display panel support is the flexible display panel support according to the embodiment of the present disclosure.

BRIEF DESCRIPTION OF DRAWINGS

To more clearly illustrate the technical schemes of the embodiments of the present disclosure, the drawings of the embodiments will be briefly introduced below, and it is apparent that the drawings in the following description only relate to some embodiments of the present disclosure and are not intended to limit the present disclosure.

DETAIL DESCRIPTION OF EMBODIMENTS

Figure 1:
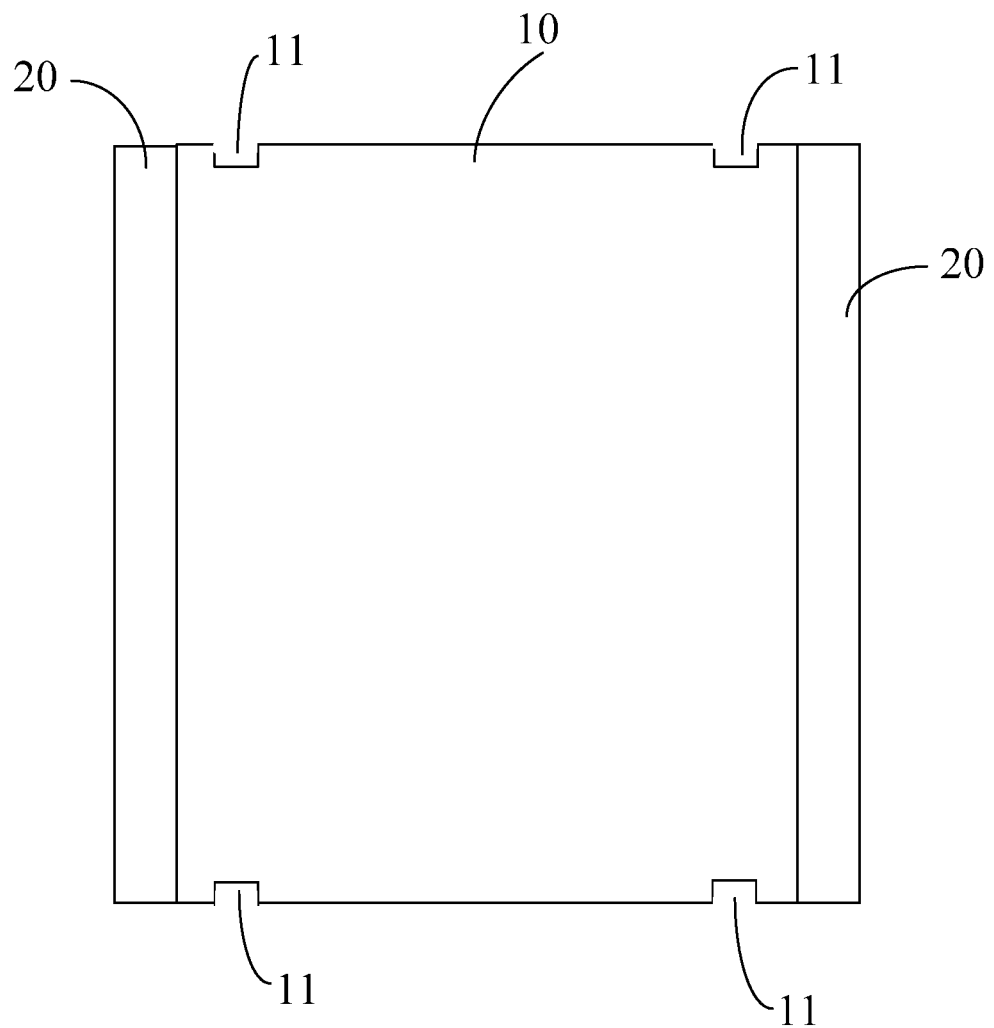
FIG. 1 is a first schematic front view illustrating a structure of a support body of a flexible display panel support according to at least one embodiment of the present disclosure.

The present disclosure is described in detail below. Examples of embodiments of the present disclosure are illustrated in the accompanying drawings, in which the same or similar reference numerals are used throughout the drawings to refer to the same or equivalent elements or elements with the same or similar functions. In addition, if a detailed description of a known technology is not necessary for the features of the present disclosure shown, it is omitted. The embodiments described below with reference to the accompanying drawings are exemplary only for explaining the present disclosure and are not construed as limiting the present disclosure.

It will be understood by those skilled in the art that, unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the existing technology and will not be interpreted in an idealized or overly formal sense unless expressly so defined herein.

As used herein, the singular forms "a", "an" and "the" are intended to include the plural forms as well, unless the context clearly indicates otherwise. It will be understood that when an element is referred to as being "connected" or "coupled" to another element, it can be directly connected or coupled to the other element or intervening elements may also be present. Further, "connected" or "coupled" as used herein may include wirelessly connected or wirelessly coupled. As used herein, the wording "and/or" includes all or any element and all combinations of one or more of the associated listed items.

For some three-dimensional foldable screens (with a curved plane), since the flexible display panel support has a curved plane structure, it is difficult to implement alignment of the flexible display panel support with the display panel by the conventional manner of capturing intersection points of the boundaries.

At least one embodiment of the present disclosure provides a flexible display panel support 1 including a support body. The support body includes a plane region 10 and two curved regions 20 located on two sides of the plane region 10. An alignment mark structure 11 is disposed on the support body, and the alignment mark structure 11 is located in the plane region 10 and is at a position corresponding to a non-display area of the flexible display panel 2 to implement alignment of the support body with the flexible display panel 2.

Figure 2:
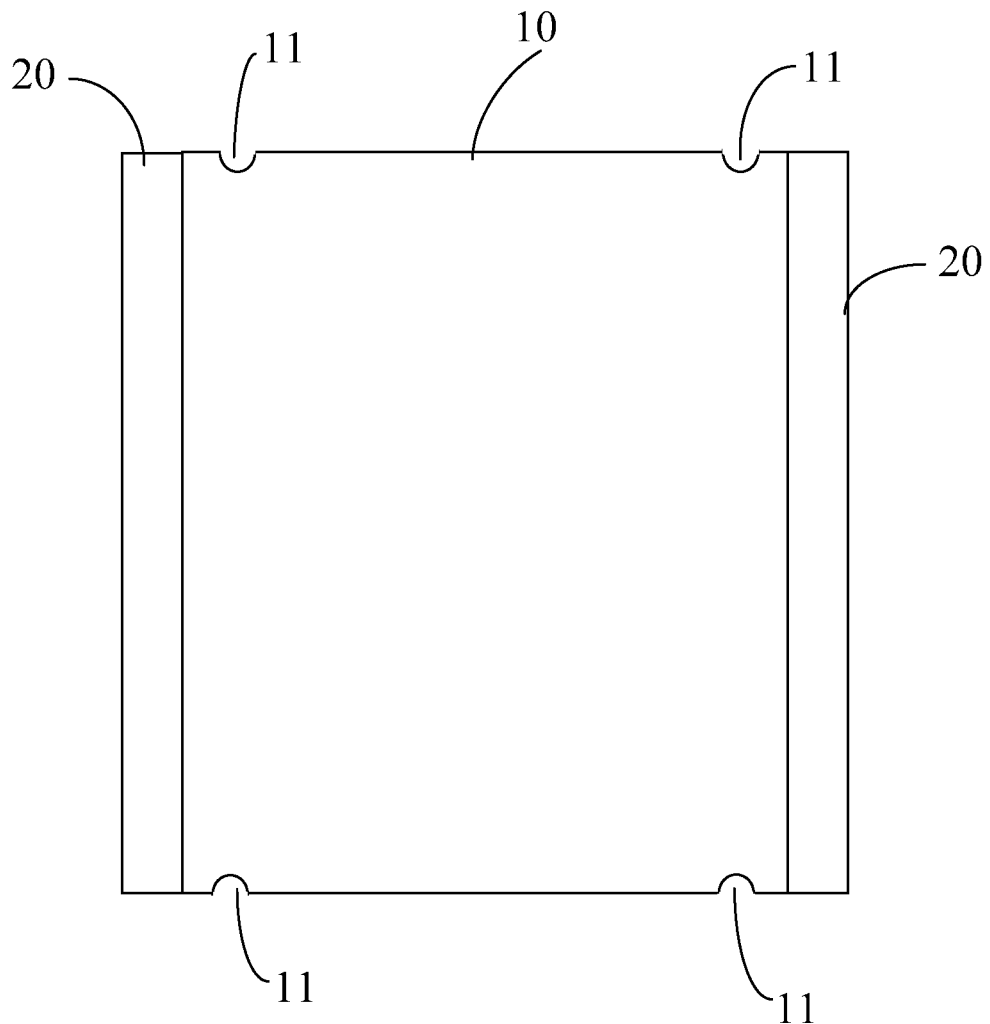
FIG. 2 is a second schematic front view illustrating a structure of a support body of a flexible display panel support according to at least one embodiment of the present disclosure.
Figure 3:
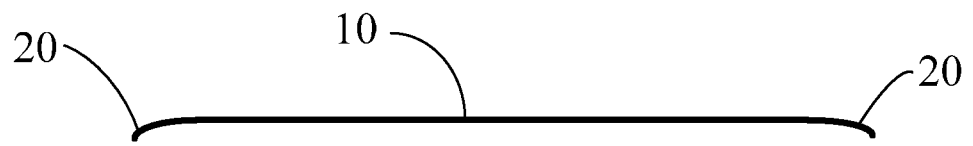
FIG. 3 is a schematic top view illustrating the structure of the support body of the flexible display panel support according to at least one embodiment of the present disclosure.
Figure 4:
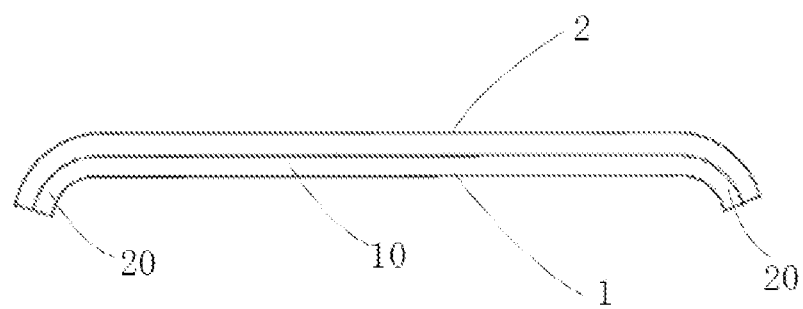
FIG. 4 is a schematic view illustrating the flexible display panel support and a flexible display panel which attached to each other according to at least one embodiment of the present disclosure.

FIG. 1 and FIG. 2 are two schematic front views illustrating a structure of a support body of the flexible display panel support 1 according to at least one embodiment of the present disclosure, and FIG. 3 is a schematic top view illustrating the structure of the support body of the flexible display panel support 1 according to at least one embodiment of the present disclosure. The support body may include a plane region 10 in the middle and two curved regions 20 at two sides. The plane region 10 and the curved regions 20 may be of an integrally formed sheet structure, namely, the support body may be of a bent structure that is flat in the middle and warped at two sides, and may be formed of a one-piece panel material through a bending process. As shown in FIG. 4, the flexible display panel 2 of this embodiment may be any flexible display panel 2 in the existing technology that is required to be attached to a support body of a flexible display panel support 1 to form a curved plane structure. The flexible display panel 2 may be provided with a positioning mark structure, and the position of the flexible display panel 2 may be determined according to the positioning mark structure. The alignment mark structure 11 on the support body may be correspondingly disposed according to the positioning mark structure on the flexible display panel 2 to implement alignment of the support body with the flexible display panel 2 through the alignment mark structure 11 and the positioning mark structure. It should be noted that, the specific position and structure of the alignment mark structure 11 of the support body are not specifically limited in this embodiment, as long as the alignment of support body and the flexible display panel 2 can be realized.

In a practical application process, the flexible display panel 2 and the support body may be first transported through a transportation device to an attachment station and then be mechanically attached by an attachment apparatus. Specifically, the principle and process for realizing alignment and attachment of the support body and the flexible display panel 2 are as follows: the specific position of the flexible display panel 2 is first determined according to the positioning mark structure on the flexible display panel 2, then the specific position of the support body is determined according to the alignment mark structure 11 on the support body, thereafter the relative position of the support body with respect to the flexible display panel 2 is determined according to the specific position of the flexible display panel 2 and the specific position of the support body, and then the specific position of the support body is adjusted according to the relative position until the support body is aligned with and attached to the flexible display panel 2. The alignment mark structure 11 on the support body is correspondingly disposed (including the position and quantity) according to the positioning mark structure on the flexible display panel 2. Generally, a plurality of alignment mark structures 11 and a plurality of positioning mark structures are correspondingly disposed. When the support body is just aligned with and attached to the flexible display panel 2, the alignment mark structure 11 of the support body may coincide with the positioning mark structure of the flexible display panel 2. In this case, during the attachment, all that is necessary is to adjust the position of the support body so that the alignment mark structure 11 coincides with the positioning mark structure of the flexible display panel 2. Alternatively, the respective alignment mark structures 11 of the support body may have designated relative positions with respect to the respective positioning mark structures of the flexible display panel 2. In this case, during the attachment, all that is necessary is to adjust the position of the support body so that the alignment mark structure 11 of the support body have the designated relative positions with respect to the positioning mark structure of the flexible display panel 2. Preferably, it may be set that each of the relative position of each alignment mark structure 11 with respect to its corresponding positioning mark structure is the same when the support body is just aligned with and attached to the flexible display panel 2. In this case, during the attachment, the relative position of each positioning mark structure with respect to its corresponding positioning mark structure can be determined. If at least one of the relative position of the alignment mark structure with respect to its corresponding positioning mark structure is different from other relative positions of the alignment mark structures with respect to its corresponding positioning mark structures, the support body is adjusted until all the relative positions of each alignment mark structure 11 with respect to its corresponding positioning mark structure are the same.

The flexible display panel support 1 according to this embodiment includes a support body, which is a three-dimensional structure including a plane region 10 and curved regions 20, and an alignment mark structure is disposed in the plane region 10. The specific position of the support body can be determined through the alignment mark structure 11, and further relative positions of the support body with respect to the flexible display panel 2 can be determined. The support body is adjusted according to the relative positions, so that alignment and attachment of the support body and the flexible display panel 2 can be implemented, the attachment precision between the support body and the flexible display panel 2 can be increased, and the product yield of the display device including the flexible display panel support 1 and the flexible display panel 2 can be improved. Also, by disposing the alignment mark structure 11 at a position of the plane region 10 corresponding to a non-display area of the flexible display panel 2, adverse effects caused by the alignment mark structure 11 on the display effect of the display device including the flexible display panel support 1 can be prevented.

It should be noted that the specific curvature radius of the curved regions 20 of the support body may be specifically designed according to practical needs, which is not particularly limited in this embodiment. In addition, the flexible display panel support 1 according to this embodiment may further include other components besides the support body, such as a connector connected to the flexible display panel 2 (or other components). The support body may further include other structures besides the alignment mark structure 11, such as a connection hole.

In a specific embodiment of the present disclosure, the flexible display panel support 1 may be made of a material including stainless steel, i.e., the support body may be a stainless steel sheet. The stainless steel sheet can be made into a curved plane with a certain curvature radius due to certain flexibility, and can also support the flexible display panel 2 due to certain strength, so that the flexible display panel 2 has a same three-dimensional curved plane structure as the stainless steel sheet. Moreover, the processing technology of stainless steel is mature, the processing control is easy, and the cost is low. It should be noted that the support body is made of stainless steel sheet is only a preferred implementation of this embodiment, and this embodiment is not limited to this implementation, and the support body of this embodiment may be made of any material as long as the curved plane structure of the support body and the supporting function can be realized.

In another implementation of this embodiment, the alignment mark structure 11 may include a notch formed at an edge of the support body. A notch is disposed on support body, and an orthographic projection of the notch on a plane (or on an attachment surface) parallel to the plane region 10 may be a comparatively clear boundary line. A central position of the boundary line may be determined by capturing all points of the boundary line, and further a central position of the notch is determined. The specific position of the support body may be determined through the central position of a plurality of notches, thus the position of the support body can be accurately determined. Specifically, a coordinate plane may be established on a plane parallel to the attachment surface, and a coordinate system is established with the center of the flexible display panel 2 (or the center of the support body) as the central coordinate when the support body is just attached to the flexible display panel 2. The attachment apparatus may capture all points of the positioning mark structure of the flexible display panel 2 in the parallel coordinate plane and determine the coordinate data of the respective points, then specific positions of the respective positioning mark structures of the flexible display panel 2 can be determined according to all the coordinate data, and further the specific position of the flexible display panel 2 can be determined according to the specific positions of the respective positioning mark structures. Thereafter, the specific positions of the respective alignment mark structures 11 of the support body are determined by the same method, and then the specific position of the support body is determined according to the specific positions of the respective alignment mark structures. Then relative positions of the support body with respect to the flexible display panel 2 can be determined according to the specific positions of the support body and the flexible display panel 2, and further the support body is adjusted according to the relative positions to enable the specific positions of the support body and the flexible display panel 2 to be consistent with each other, thereby implementing alignment and attachment of the support body and the flexible display panel 2.

It should be noted that the alignment mark structure 11 according to this embodiment is not limited to the above-mentioned notch structure, and which may be, for example, a groove or a recess formed at an edge of the support body.

Further, as shown in FIG. 1, an orthographic projection of the notch on a plane parallel to the plane region 10 has a shape including three edges of a rectangle, thus the boundary line of the notch on the attachment surface is three connected straight lines, in which case the boundary line of the notch is more regular, which brings forth simpler processing, and facilitates the attachment device capturing all points of the boundary line, so that attachment device can determine the position of the support body more conveniently.

As further shown in FIG. 2, an orthographic projection of the notch on a plane parallel to the plane region 10 has a shape including a circular arc. When a central position of the notch is determined through the circular arc boundary line, the coordinate of a single point on the circular arc has a small influence on the central position of the notch. Therefore, the determined central position of the notch and the position of the support body can be more accurate by calculating the central position of the notch through the circular arc boundary line, thereby improving the attachment precision between the support body and the flexible display panel 2.

Preferably, as shown in FIG. 2, the central angle of the circular arc may be less than or equal to 180°. In a case where the central angle of the circular arc is equal to 180°, the circular arc is a semi-circle. Since a semicircular arc is more regular, the position of the notch can be calculated more accurately. In a case where the central angle of the circular arc is less than 180°, a length of the circular arc extending from the edge of the plane region 10 to the display area may be appropriately reduced to ensure that the position of the notch corresponds to the non-display area of the flexible display panel 2.

It should be noted that that the orthographic projection of the notch on the plane parallel to the plane region 10 has a circular arc shape and that the central angle of the circular arc is less than or equal to 180° are a preferred implementation of this embodiment, and this embodiment is not limited to this implementation. For example, the orthographic projection of the notch on the plane parallel to the plane region 10 may also have an elliptic shape, and the central angle of the circular arc may also be slightly greater than 180°.

In another specific implementation of this embodiment, the plane region 10 may be rectangular, and the two curved regions 20 are located on two opposite side edges of the plane region 10, respectively: the number of the notch is plural, and both the other two opposite side edges of the plane region 10 are provided with at least one notch. The two side edges of the plane region 10, which are not provided with the curved regions 20, are both provided with the notches. The notches may be dispersedly arranged to avoid a larger error caused by the notches arranged collectively in case of measurement error existing in the positions of the notches, thus improving the calculation precision of the position of the support body.

Furthermore, the at least one notches on both the other two opposite side edges of the plane region 10 are disposed symmetrically relative to the center of the plane region 10, so that the plurality of notches can be disposed more uniformly, which can reduce or cancel out the error in multi-point measurement, thereby further improving the calculation precision of the central position of the notch.

Furthermore, two notches are disposed correspondingly on each of the other two opposite side edges of the plane region 10, and the two notches are each located at a position close to a corner of the plane region 10. Generally, four positioning mark structures are disposed at positions close to the vertexes of the flexible display panel 2, respectively. Two notches are respectively disposed on each of the other two side edges of the support body, which are exactly in one-to-one correspondence with the four positioning mark structures of the flexible display panel 2. The relative position of the support body with respect to the flexible display panel 2 can be determined according to the relative position of each alignment mark structure 11 with respect to its corresponding positioning mark structure, thus the position determination can be more accurate, and the calculation process is simpler and faster.

Based on the same concept of the foregoing embodiment, this embodiment further provides a flexible display device, including a flexible display panel support 1 and a flexible display panel 2, and the flexible display panel support 1 is the flexible display panel support 1 of any one of the above implementations.

The display device according to this embodiment includes the flexible display panel support 1 of any one of the above implementations, which can at least realize the advantageous effect of the flexible display panel support 1 above. That is, the support body of the flexible display panel support is a three-dimensional structure including a plane region 10 and curved regions 20, and an alignment mark structure 11 is disposed in the plane region 10. The specific position of the support body can be determined through the alignment mark structure 11, and further the relative position of the support body with respect to the flexible display panel 2 can be determined. The support body is adjusted according to the relative position, so that alignment and attachment of the support body and the flexible display panel 2 can be implemented, the attachment precision between the support body and the flexible display panel 2 can be increased, and the product yield of the display device including the flexible display panel support 1 and the flexible display panel 2 can be improved. Also, by disposing the alignment mark structure 11 in the plane region 10 and at a position corresponding to a non-display area of the flexible display panel 2, adverse effects caused by the alignment mark structure 11 on the display effect of the display device including the flexible display panel support 1 can be prevented.

Those of skill in the art will understand that various operations, methods, steps in the flow, measures, schemes discussed in the present disclosure can be alternated, modified, combined, or deleted.

In the description of the present disclosure, it is to be understood that the terms "center", "upper", "lower", "front", "rear", "left", "right", "vertical", "horizontal", "top", "bottom", "inner", "outer", and the like indicate orientations or positional relationships based on those shown in the drawings, are merely for convenience of description and simplicity of description, and do not indicate or imply that the device or element referred to must have a particular orientation, be constructed and operated in a particular orientation, and thus, are not to be construed as limiting the present invention.

The foregoing is only a few embodiments of the present disclosure and it should be noted that those skilled in the art can make various improvements and modifications without departing from the principle of the present disclosure, and that these improvements and modifications should also be considered as the protection scope of the present disclosure.

What is claimed is:

1. A flexible display device comprising a flexible display panel support and a flexible display panel, wherein the flexible display panel support comprises a support body, and the support body comprises a plane region and two curved regions located at two sides of the plane region, wherein an alignment mark structure is disposed on the support body, and the alignment mark structure is located in the plane region and is at a position corresponding to a non-display area of the flexible display panel to implement alignment of the support body with the flexible display panel.

2. The flexible display device of claim 1, wherein the alignment mark structure comprises a notch formed at an edge of the support body.

3. The flexible display device of claim 2, wherein an orthographic projection of the notch on a plane parallel to the plane region has a shape comprising three edges of a rectangle.

4. The flexible display device of claim 3, wherein the plane region is rectangular, and the two curved regions are located on two opposite side edges of the plane region, respectively; and the number of the notch is plural, and both other two opposite side edges of the plane region are provided with at least one of the notches.

5. The flexible display device of claim 2, wherein an orthographic projection of the notch on a plane parallel to the plane region has a shape comprising a circular arc.

6. The flexible display device of claim 5, wherein a central angle of the circular arc is less than or equal to 180°.

7. The flexible display device of claim 6, wherein the plane region is rectangular, and the two curved regions are located on two opposite side edges of the plane region, respectively; and the number of the notch is plural, and both other two opposite side edges of the plane region are provided with at least one of the notches.

8. The flexible display device of claim 5, wherein the plane region is rectangular, and the two curved regions are located on two opposite side edges of the plane region, respectively; and the number of the notch is plural, and both other two opposite side edges of the plane region are provided with at least one of the notches.

9. The flexible display device of claim 2, wherein the plane region is rectangular, and the two curved regions are located on two opposite side edges of the plane region, respectively; and the number of the notch is plural, and both other two opposite side edges of the plane region are provided with at least one of the notches.

10. The flexible display device of claim 9, wherein the at least one of the notches on both the other two opposite side edges of the plane region are disposed symmetrically with respect to a center of the plane region.

11. The flexible display device of claim 9, wherein two notches are correspondingly disposed on each of the other two opposite side edges of the plane region, and the two notches are each located at a position close to a corner of the plane region.

12. The flexible display device of claim 1, wherein the flexible display panel support is made of a material comprising stainless steel.

* * * * *